United States Patent [19]
Chang et al.

[11] Patent Number: 5,646,060
[45] Date of Patent: Jul. 8, 1997

[54] METHOD FOR MAKING AN EEPROM CELL WITH ISOLATION TRANSISTOR

[75] Inventors: Ko-Min Chang; Danny Pak-Chum Shum; Kuo-Tung Chang, all of Austin, Tex.

[73] Assignee: Motorola, Inc., Schaumburg, Ill.

[21] Appl. No.: 471,619

[22] Filed: May 30, 1995

Related U.S. Application Data

[62] Division of Ser. No. 225,868, Apr. 11, 1994, Pat. No. 5,471,422.

[51] Int. Cl.⁶ .................................. H01L 21/8247
[52] U.S. Cl. ...................... 437/43; 437/52; 437/50
[58] Field of Search ........................ 437/43, 52, 50

[56] References Cited

U.S. PATENT DOCUMENTS

| | | | |
|---|---|---|---|
| 4,302,766 | 11/1981 | Guterman et al. | 357/41 |
| 4,420,871 | 12/1983 | Scheibe | 29/571 |
| 4,639,893 | 1/1987 | Eitan | 365/185 |
| 4,907,197 | 3/1990 | Uchida | 365/185 |
| 5,021,848 | 6/1991 | Chiu | 357/23.5 |
| 5,045,488 | 9/1991 | Yeh | 437/43 |
| 5,049,515 | 9/1991 | Tzeng | 437/43 |
| 5,049,516 | 9/1991 | Arima | 437/43 |
| 5,081,054 | 1/1992 | Wu et al. | 437/43 |
| 5,104,819 | 4/1992 | Freiberger et al. | 437/43 |
| 5,395,779 | 3/1995 | Hong | 437/43 |

*Primary Examiner*—John Niebling
*Assistant Examiner*—Michael S. Lebentritt
*Attorney, Agent, or Firm*—Patricia S. Goddard

[57] ABSTRACT

An EEPROM cell (40) includes a floating gate transistor (47) and an isolation transistor (45). Both a floating gate (48) and an isolation gate (46) are formed on a tunnel dielectric (44) within the cell. The isolation gate is coupled to a doped source region (52) of the floating gate transistor. The isolation transistor is not biased during a program operation of the cell, enabling a thin tunnel dielectric (less than 120 angstroms) to be used beneath all portions of both gates within the cell. Thus, the need for both a conventional tunnel dielectric and a gate dielectric is eliminated. The cell tolerates over-erasure, can be programmed at low programming voltages, and has good current drive due to the thin tunnel dielectric throughout the cell.

17 Claims, 4 Drawing Sheets

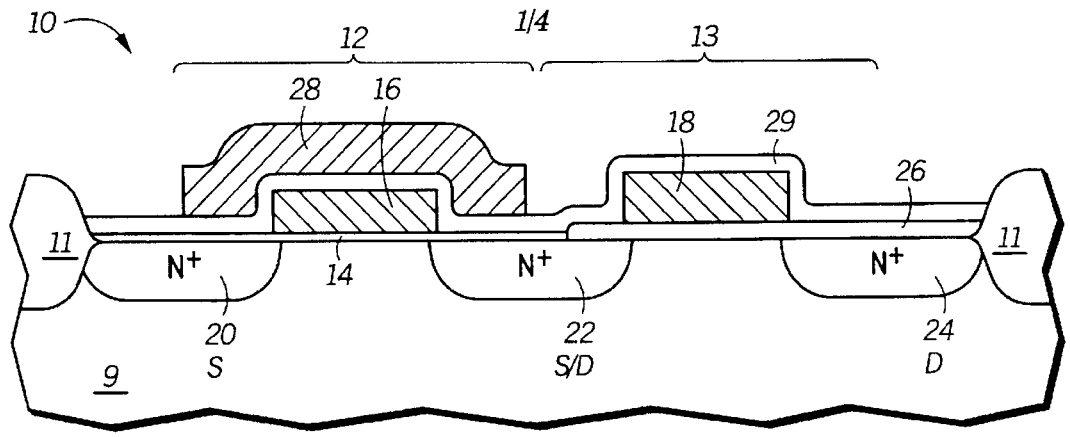
FIG.1
-PRIOR ART-
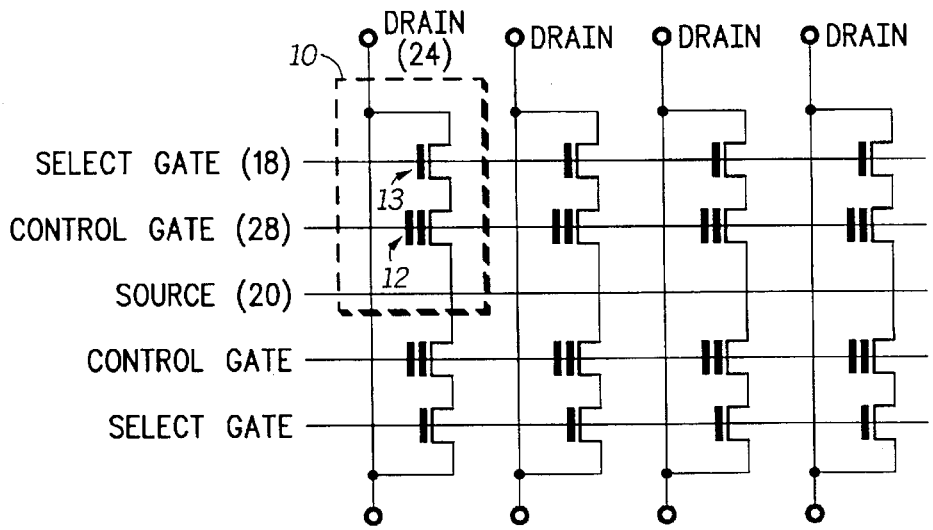
FIG.2
-PRIOR ART-
| OPERATION | VOLTAGE APPLIED | | | |
|---|---|---|---|---|
| | SOURCE | SELECT GATE | CONTROL GATE | DRAIN |
| PROGRAM | FLOAT | $V_{PP}$ | 0 | $V_{PP}$ |
| ERASE | 0 | 0 | $V_{PP}$ | 0 |
| READ | 0 | $V_{CC}$ | 0 | 1 |
FIG.3
-PRIOR ART-

| OPERATION | VOLTAGE APPLIED ||||
| --- | --- | --- | --- | --- |
| | SOURCE | ISOLATION GATE | CONTROL GATE | DRAIN |
| PROGRAM | 0 | 0 | 8 | 6 |
| ERASE | 0 | 0 | −10 | 5 |
| READ | 0 | $V_{CC}$ | $V_{CC}$ (0) | 1 |
*FIG. 6*
| OPERATION | VOLTAGE APPLIED ||||
| --- | --- | --- | --- | --- |
| | SOURCE | ISOLATION GATE | CONTROL GATE | DRAIN |
| PROGRAM | 0 | 0 | −10 | 6 |
| ERASE | 0 | 0 | 12 | 0 |
| READ | 0 | $V_{CC}$ | 0−2 | 1 |
*FIG. 7*
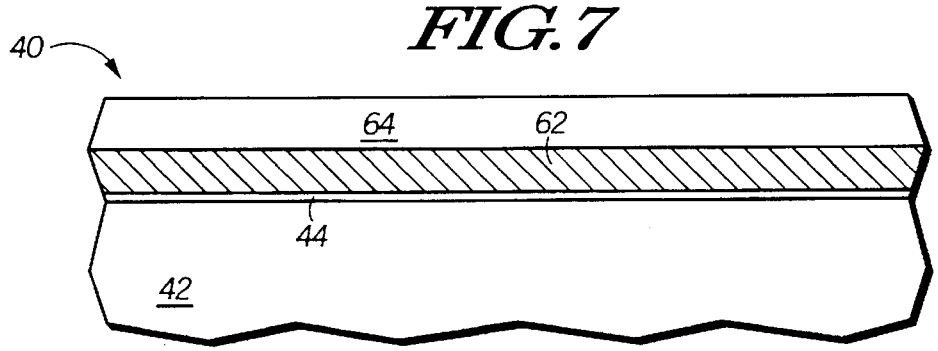
*FIG. 8*
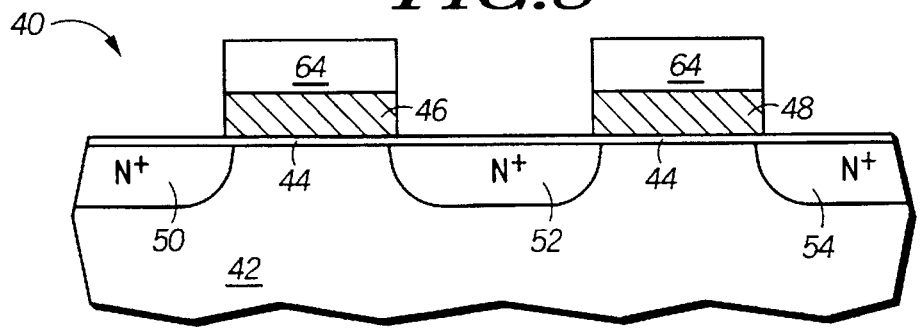
*FIG. 9*

METHOD FOR MAKING AN EEPROM CELL WITH ISOLATION TRANSISTOR

This is a divisional of application Ser. No. 08/225,868, filed Apr. 11, 1994, now U.S. Pat. No. 5,471,422.

FIELD OF THE INVENTION

The present invention relates generally to non-volatile semiconductor memory devices, and more particularly to electrically erasable and programmable read-only memory (EEPROM) devices.

BACKGROUND OF THE INVENTION

EEPROMs are non-volatile memory devices which are erased and programmed using electrical signals. Within an EEPROM device are a plurality of memory cells, each of which may be individually programmed and erased. In general, each EEPROM cell has two transistors. As an example, a FLOTOX (floating gate-tunnel oxide) EEPROM cell includes a floating gate transistor and a select transistor. The select transistors in an EEPROM device are used to select individual EEPROM cells which are to be erased or programmed. The floating gate transistors in the device are those transistors which actually perform the erase and program operations in the individual cells. To program and erase a cell, a phenomenon known as Fowler-Nordheim tunneling is used to store either a positive or a negative charge, respectively, on a floating gate electrode of the floating gate transistor. Programming is accomplished by applying a positive voltage to a drain and a control gate of the select gate transistor while a control gate of the floating gate transistor is held at ground. As a result, electrons tunnel from the floating gate of the floating gate transistor through a tunnel dielectric to the drain, leaving the floating gate positively charged. An EEPROM cell is erased by storing negative charge on the floating gate. Negative charge storage on the floating gate is generally achieved by applying a positive voltage to the control gate of the transistor while grounding the drain and source. Such a bias causes electrons to tunnel from the channel regions through the tunnel dielectric to the floating gate, creating a negative charge on the floating gate.

One disadvantage of most EEPROM devices is that cell size is large, due to the fact that each cell has two transistors. In applications where circuit density is extremely important, an EEPROM cell may not be feasible. Another disadvantage is process complexity in that most EEPROM cells use two different gate oxide or dielectric thicknesses to achieve floating gate discharge. A thicker gate oxide is needed when applying a positive voltage to a drain of the select transistor during discharge, as compared to a thinner oxide which is needed to accomplish electron tunneling. The thicker gate oxide can reduce hot electron degradation induced from the high voltage applied on the drain. The applied high voltage also increases the spacing between the two transistors to reduce junction punch-through, making the EEPROM cell scaling harder.

An alternative to above mentioned EEPROM, is a flash EEPROM. Flash EEPROMs provide electrical erasing and programming capability, but generally have a increased circuit density since only one transistor per cell is needed. Several different structures have been demonstrated for use as flash EEPROMs, for example an ETOX (EPROM tunnel oxide) cell. Functionally, a flash EEPROM may be programmed by hot electron injection and erased via Fowler-Nordheim tunneling. Hot electron injection method is fast, typically taking about 10 µs.

A disadvantage which might be made in performance if a flash EEPROM is used is a programming time delay caused by a problem known as "over-erase." In a flash EEPROM, erasing is accomplished by applying a bias to a source so that electrons stored in a floating gate tunnel to the source region. However in doing so, the floating gate often becomes positively charged, thereby lowering the threshold voltage ($V_T$) of the channel region. Lower $V_T$ values correspond to weak hot electron generation, thus time involved in programming a memory cell is increased. Typically in programming a flash EEPROM cell, a control gate and a drain region are brought to a relatively high voltage, thereby creating an electric field at a junction of the channel region and drain and generating hot electrons at the junction. These electrons are then injected into the floating gate, thereby charging, or programming, the cell. If $V_T$ is low, the electric field which is created is weak, and electron generation at the junction is reduced. Thus, a lower $V_T$ implies a longer programming time. Another major problem of an over-erased cell is that it can act as a leakage source in a memory array. Such a leakage source can render an erroneous read of an adjacent cell.

One way to offset the longer programming time caused by the over-erase problem is to use a higher programming voltage. However, the trend in integrated circuits (ICs), especially those for portable electronic applications, is to reduce the power required to operate the chip. As the power supply voltage ($V_{CC}$) is reduced, so to is the cell programming voltage, yet with low programming voltages the over-erase problem again emerges.

One solution to overcome read error caused by excessive leakage current from the over-erase problem is to add convergence or repairing to an over-erased bitcell. Repairing is a "low level" programming method and requires programming current and repairing time. For high density low voltage applications, where on-chip charge pumps are operated, programming current can be as high as amperes in block-erase. Yet, on-chip charge pumps have limited current sourcing capabilities. Thus, programming currents in cells with on-chip charge pumps are also limited, resulting in prolonged repair time caused by over-erase.

Therefore, a low voltage, low power, non-volatile memory cell which overcomes the problem of delayed programming times and delayed erased times without over-erase problem would be desirable. More specifically, it would be desirable for such a cell to have low program and erase currents, low program and erase voltages, yet sufficient read current for sensing the state of the cell. Moreover, it would be desirable for such a cell to be manufactured without significant process complexity and by a process which is compatible with existing metal-oxide-semiconductor (MOS) processing.

SUMMARY OF THE INVENTION

One form of the invention is an electrically erasable and programmable read-only memory cell. Within the cell, a tunnel dielectric is formed on a semiconductor substrate. The cell has a floating gate transistor and an isolation transistor. A floating gate of the floating gate transistor is formed on the tunnel dielectric. Likewise, an isolation gate of the isolation transistor is formed on the tunnel dielectric. The tunnel dielectric is substantially uniform in thickness beneath the floating gate and isolation gate within the cell. The tunnel dielectric thickness is less than approximately 120 angstroms. Other embodiments of the present invention include a method for making the cell described above, and methods for programming the cell.

5,646,060

BRIEF DESCRIPTION OF THE DRAWINGS

FIG. 1 is a cross-sectional illustration of a prior art EEPROM cell.

FIG. 2 is a circuit diagram of an EEPROM array having the cell illustrated in FIG. 1.

FIG. 3 is a table demonstrating one method for operating the cell of FIG. 1.

FIG. 6 is a table demonstrating one method for operating the cell of FIGS. 4A and 4B wherein the erase operation is selective, in accordance with the present invention.

FIG. 7 is a table demonstrating another method for operating the cell of FIG. 4 wherein the erase operation is not selective, also in accordance with the present invention.

FIGS. 8–10 illustrate in sequential cross-sectional views one method for forming the cell illustrated in FIGS. 4A and 4B in accordance with the present invention.

DETAILED DESCRIPTION OF A PREFERRED EMBODIMENT

Figure 4A:
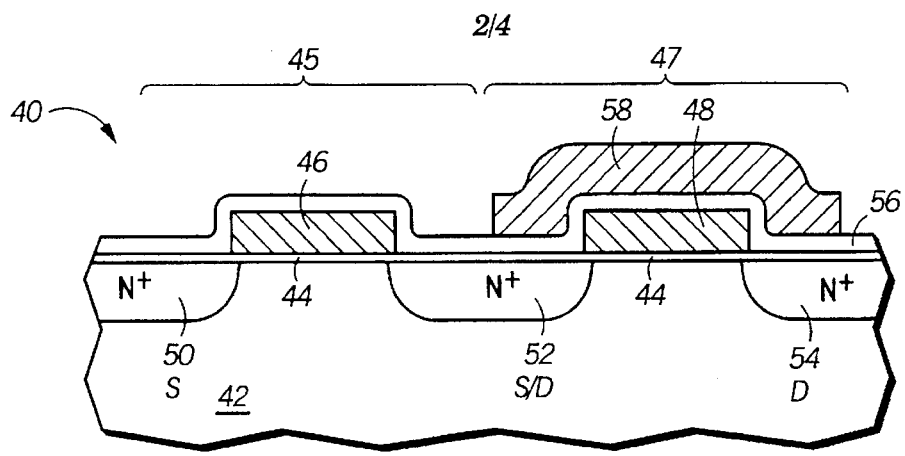
FIG. 4A is a cross-sectional illustration of an EEPROM cell in accordance with the present invention, taken along the line A—A of FIG. 4B.

The present invention overcomes many of the problems of conventional EEPROMs and flash EEPROMs discussed above. In one form of the invention, a memory cell includes two transistors, a floating gate transistor and an isolation transistor. The isolation transistor is coupled to a source side of a cell, whereas conventional EEPROMs employing two transistors (a floating gate transistor and a select transistor) typically have the select transistor coupled to a drain side of the cell. Furthermore, a cell in accordance with the present invention has both the isolation gate and floating gate formed on a thin tunnel dielectric, as opposed to conventional EEPROM cells wherein the floating gate is formed on a tunnel dielectric but wherein the select gate is formed on a thicker gate dielectric. Since the isolation transistor is coupled to the source side of the cell in the present invention, the isolation gate is not involved during programming, and a thinner tunnel dielectric may be used beneath the isolation gate. In conventional EEPROM cells, a thicker gate dielectric is required beneath the select gate to withstand typical programming voltages in excess of 10 volts. While cell size of a memory device in accordance with the present invention is somewhat larger than a conventional one transistor flash EEPROM, the cell is quite scalable since the need for two separate substrate level dielectric layers (a tunnel dielectric and a gate dielectric) is not necessary. Furthermore, the elimination of a substrate level gate dielectric layer simplifies the fabrication process.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

FIGS. 1–3 are directed to a conventional EEPROM cell 10. FIG. 1 is a cross-sectional view of cell 10. FIG. 2 is a circuit diagram of an array of cells like cell 10. FIG. 3 is a table demonstrating operation of cell 10. As illustrated in FIG. 1, cell 10 includes a semiconductor substrate 9 made of silicon, gallium arsenide, or the like. Along peripheral portions of cell 10 are field isolation regions 11 which are used to electrically isolate adjacent cells within an array of cells. Formed in and on substrate 9 are two transistors, a floating gate transistor 12 and a select gate transistor 13. Floating gate transistor 12 includes a tunnel dielectric 14, such as an oxide, formed on the substrate. Floating gate transistor 12 also includes a floating gate 16, a control gate 28, and an interlayer dielectric layer 29 separating the gates 16 and 28. Because the gates are typically formed of polysilicon, dielectric layer 29 is also known as an interpoly dielectric. Further, floating gate transistor 12 includes a doped source region 20, and a doped drain region 22, both formed in the substrate. Select transistor 13 includes a select gate 18 and a gate dielectric layer 26 separating gate 18 from substrate 9. On opposing sides of select gate 18 are doped source region 22 and doped drain region 24 of the select transistor. Note that doped region 22 both serves as the source of select transistor 13 and as the drain for floating gate transistor 12. If a P-type semiconductor substrate is used, doped regions 20, 22, and 24 are N-type, as FIG. 1 indicates.

Cell 10 as illustrated in FIG. 1 can be formed by any of numerous conventional processes, one of which will be briefly described. In one process, field isolation regions 11 are formed in a silicon substrate 9 by any conventional method. Then, gate dielectric layer 26 is formed on the substrate. A mask is formed over the select gate region 18 and any peripheral circuitry to protect from a subsequent chemical wet etch which removes unmasked portions of gate dielectric layer 26. As a result, dielectric layer 26 is removed from substrate in the region of floating gate transistor 12. Following dielectric removal, tunnel dielectric 14 and a first polysilicon layer are grown and deposited, respectively, on the substrate. The polysilicon layer is patterned using conventional lithography to form floating gate 16 and select gate 18. Next, an interlayer dielectric layer 29 (which may be a series of dielectric layers) is deposited over the floating gate and the substrate. An ion implantation step is then performed to form doped regions 20, 22, and 24 which are self-aligned to edges of floating gate 16 and select gate 18. A second polysilicon layer is then deposited on the interlayer dielectric 29, and is patterned to form control gate 28.

FIG. 2 illustrates a memory array formed of a plurality of cells 10. Note that each select transistor 13 is coupled to the drain side of each floating gate transistor 12. In operation, cell 10 is programmed, erased, and read in accordance with the table illustrated in FIG. 3. As FIG. 3 indicates, during a program operation, the select transistor is turned on by applying a programming voltage ($V_{pp}$) of between 16–20 volts to both the select gate and drain of the select transistor (which is also the drain of cell 10). The dielectric layer between select gate 18 and substrate 9 must be able to withstand such high voltages. Thus, typical tunnel dielectric thicknesses (less than 120 angstroms) cannot be used beneath select gate 18. Instead, a thicker gate dielectric 26 (200–500 angstroms) is used.

Figure 4B:
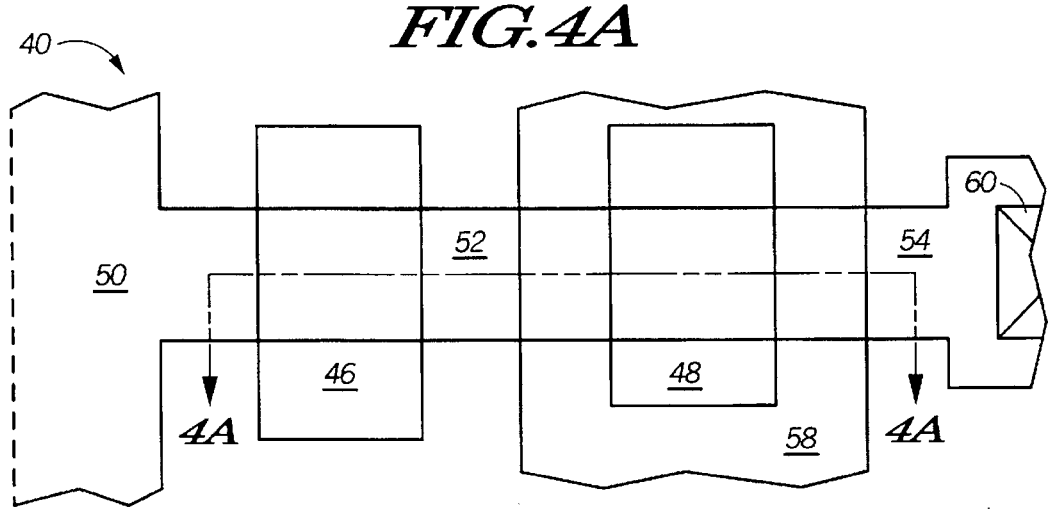
FIG. 4B is a top view of the EEPROM cell illustrated in FIG. 4A.

In accordance with the present invention, a lower programming voltage can be used and the fabrication process can be simplified because the need for two different dielectric thickness is eliminated. FIG. 4B illustrates a top view of a memory cell 40 in accordance with the present invention. FIG. 4A illustrates cell 40 in a cross-sectional view, as taken along the line A—A. As illustrated in FIG. 4A, cell 40 includes a semiconductor substrate 42 with an overlying tunnel dielectric layer 44. There are two transistors in cell 40, an isolation transistor 45 and a floating gate transistor 47. Isolation transistor 45 has an isolation gate 46 formed on tunnel dielectric 44, and has a doped source region 50 and a doped drain region 52 formed on opposing sides of the isolation gate within the substrate. Floating gate transistor 47 has a floating gate 48 formed on tunnel dielectric 44, and has doped region 52 as a source and a doped region 54 as a drain. Floating gate transistor 47 also includes a control gate 58 overlying floating gate 48 and separated therefrom by an interlayer dielectric 56, which also overlies isolation gate 46. Note that doped region 52 serves both as a source region of floating gate transistor 47 and a drain region of isolation transistor 45. Also, doped region 50 may be referred to as the source of cell 40 and doped regions 54 as the drain of the cell. If a P-type semiconductor substrate or well is used, doped regions 50, 52, and 54 are N-type, as FIG. 4 indicates. Doping will be of P-type if an N-type substrate or well is used. Although not shown in FIG. 4A, cell 40 will also include field isolation to separate cell 40 from adjacent cells in a memory array.

The doped regions and conductive regions are also illustrated in FIG. 4B, in a top layout view of cell 40. FIG. 4B also illustrates a contact 60 made to doped region 54 which is the drain of the cell.

Figure 5:
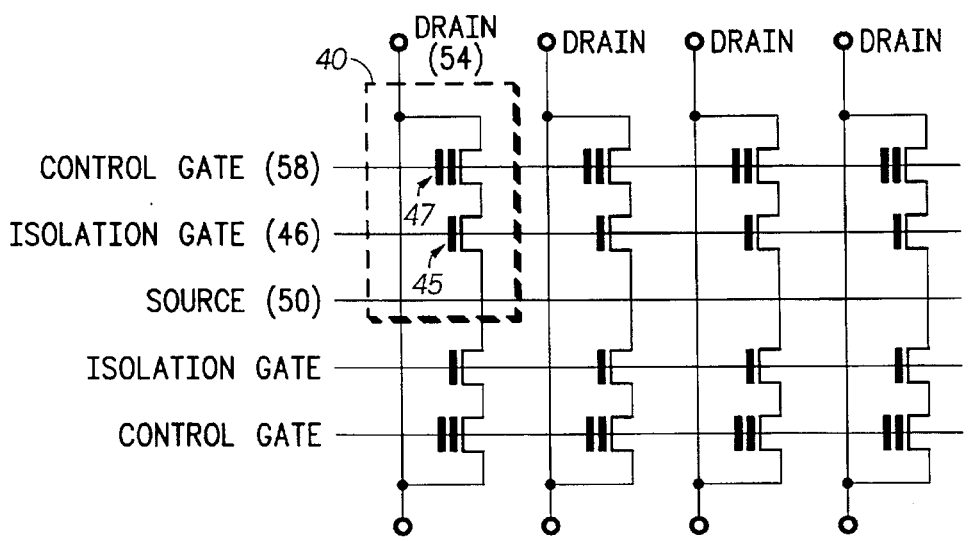
FIG. 5 is a circuit diagram of an EEPROM array having the cell illustrated in FIG. 4.

In physical structure, isolation transistor 45 resembles traditional select gate transistors well known in the art of EEPROMs. However, there are at least three important distinctions between isolation transistor 45 and conventional select transistors. First, as apparent from FIGS. 4A and 4B, and as illustrated in the circuit diagram of FIG. 5, isolation transistor 45 is coupled to the source side of the floating gate device, whereas traditional select transistors are generally coupled to the drain side of the floating gate transistor. Second, isolation gate 46 is formed on the same thin tunnel dielectric 44 (less than approximately 120 angstroms) as floating gate 48, whereas select gates are formed on traditional gate dielectric thicknesses of about 200–500 angstroms while only the floating gate is formed on a tunnel dielectric. Third, isolation gate 46 is not used in the same way that a select gate is used. Select gates are so called because a select transistor is used to select (by turning on the transistor) which cell in an array will be programmed or erased. In contrast, the isolation transistor in a cell in accordance with the present invention is turned off to isolate the cell being programmed from source 50.

The function of isolation transistor 45 will be more readily understood in the context of programming and erasing cell 40, as demonstrated by the table shown in FIG. 6. An efficient hot electron injection mechanism is used to charge the floating gate. In programming the cell, the cell source (doped region 50, which is also the source of isolation transistor 45) and isolation gate 46 are grounded. Alternatively, the cell source may be electrically floating. A positive voltage of between approximately 2 to 10 volts, and preferably 5 to 8 volts is applied to control gate 58. A positive voltage of between approximately 2 to 10 volts, and preferably 5 to 7 volts is applied to the cell drain (doped region 54, which is also the drain of floating gate transistor 47). The selection of the applied voltage to the drain is based on the junction breakdown voltage at the drain diffusion junction. The drain voltage is typically set at about 0.5 volts below the junction breakdown voltage. One suitable voltage combination is applying 8 volts to the control gate and 6 volts to the drain.

During this program operation, the drain junction depletion region is kept in a weak junction avalanche state to supply electrons to the floating gate. As a result, programming currents can be less than 1 nanoampere at a control gate voltage of 5 volts and less than 1 microampere at a control gate voltage of 9 volts. The low programming currents are achieved due to higher electron injection efficiency (and thus lower programming power consumption and less heat generation during programming) than many traditional programming methods, while maintaining programming times of about 1–100 microseconds ($\mu s$). In general, hot electron injection programming times are faster than a Fowler-Nordheim tunneling program method. Thus, programming times of a cell in accordance with the present invention are comparable to, or faster than, many other EEPROM cells.

Erasing cell 40 is accomplished by again grounding the cell source and isolation gate. A negative voltage of between approximately −5 to −20 volts, and preferably −8 to −12 volts is applied to control gate 58. A positive voltage of between approximately 0 to 5 volts, and preferably 4 to 5 volts is applied to the cell drain 54. One suitable voltage combination for erasing the cell is negative 10 volts on the control gate and a positive 5 volts on the cell drain. During the erase operation using Fowler-Nordheim tunneling, a high electric field is created across the tunnel oxide from the drain of the floating gate transistor to the control gate, while the source of the floating gate transistor is electrically floated from grounding the isolation gate transistor. As a result, electrons are tunneling from the control gate to the drain of the floating gate transistor.

The read operation of cell 40 is conventional. As indicated in FIG. 6, the cell source is grounded. A voltage equal to the power supply ($V_{CC}$) is applied to the isolation gate. The control gate is either grounded or the power supply voltage is applied. A voltage of about 1 volt is applied to the drain. The present invention enhances the read operation because the isolation transistor has a higher current drive due to use of a thinner gate dielectric (by using tunnel dielectric 44) while a conventional EEPROM has lower read current from the inherent thicker gate dielectric of the select transistor. The present invention tolerates over-erasure, permitting further scaling in threshold voltage and channel length of the isolation gate transistor. Both of these types of scaling also increase read current.

The operation parameters prescribed in FIG. 6 are applicable to embodiments of the present invention in the form of either EEPROM or flash EEPROM non-volatile memories. FIG. 7 is an alternative table of operation parameters which may be used in programming, erasing, and reading flash EEPROMs in particular (since the erase operation is not bit cell selective although programming is). To program a flash EEPROM in accordance with this alternative embodiment, a negative voltage of between approximately −5 to −15 volts, and preferably −8 to −12 volts is applied to the control gate 58; a positive voltage of between approximately 2 to 6 volts, and preferably 4 to 5 volts is applied to the cell drain 54 (which is also the drain of floating gate transistor 47); and the cell source 50 (the source of isolation transistor 45) and isolation gate 46 are grounded. To non-selectively erase a group of row or column of cells, a positive voltage of between approximately 2 to 15 volts, and preferably 10 to 12 volts is applied to the control gate 58; and the drain 54, source 50 and isolation gate 46 are grounded. A read operation is performed as in the earlier described embodiment of the invention, except that the control gate sees a positive voltage of 0 to 2 volts.

As the foregoing information indicates, the present invention has many advantages over existing EEPROMs and other non-volatile memory devices. A cell in accordance with the present invention is programmed using low voltages (e.g. less than 8 volts), which corresponds to programming currents of less than 1 microampere per bit cell. Erase voltages are likewise low (e.g. less than 10 volts). Furthermore, erase may be done either selectively on a cell-by-cell basis or in a flash erase where a column or row of cells is erased. Moreover, the combination of negative control gate bias and positive cell drain bias reduces erase current and can significantly enhance the device lifetime. In a read operation of a cell in accordance with the present invention, the use of an isolation gate establishes an over-erase tolerance. Over-erase is actually preferred in operation because then read current for a selected cell is increased. Consequently, the inventive cell and operation method results in an improved current drive. In addition, a cell in accordance with the present invention is compatible with existing MOS process flows. Manufacture of the cell involves no additional steps and no modification of steps in many existing MOS processes, as the discussion below pertaining to FIGS. 8–10 indicates.

Figure 10:
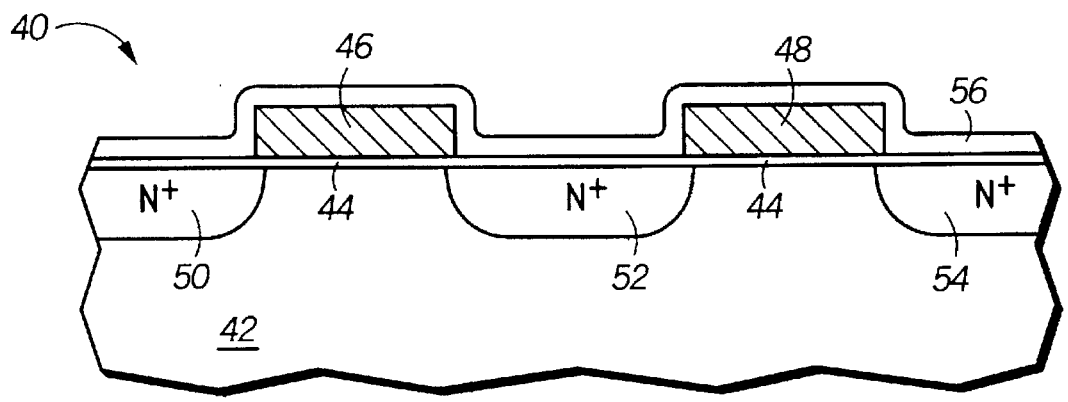

FIGS. 8–10 illustrate a series of cross-sectional views of cell 40 at various points in a manufacturing process suitable for making the cell in accordance with the present invention. As illustrated in FIG. 8, tunnel dielectric 44 is grown or deposited on substrate 42. Substrate 42 is most likely to be a silicon substrate. Tunnel dielectric 44 is preferably thermally grown silicon dioxide grown to a thickness of less than 120 angstroms, by any of several known tunnel dielectric growth processes. A first conductive layer 62, preferably polysilicon, is then deposited over the substrate and on tunnel dielectric 44 by conventional deposition techniques.

Next, the first conductive layer is patterned to form gate electrodes. This is accomplished using conventional lithographic and etching methods. For example, a photoresist layer 64 is deposited on the first conductive layer, as illustrated in FIG. 8. The photoresist layer is then selectively exposed to radiation and developed to create a mask over two portions of the cell, namely the portions where the isolation gate and the floating gate are to be formed, as illustrated in FIG. 9. After the photoresist mask is developed, exposed portions of first conductive layer are etched, leaving masked portions of the first conductive layer (i.e. select gate 46 and floating gate 48) unetched. Conventional etching methods may be used to etch exposed portions of first conductive layer 62. In removing the conductive layer, the etch may terminate on underlying tunnel dielectric layer 44, such that the tunnel dielectric remains intact across the substrate surface. Ion implantation or other known doping technique is then used to form doped source region 50, doped source/drain region 52, and doped drain region 54. Doped regions 50, 52, and 54 are self-aligned to field isolation regions 43, isolation gate 46, and floating gate 48.

Interlayer dielectric 56 is then either grown or deposited over the cell as illustrated in FIG. 10, under conventional processing conditions. Finally, the control gate is formed by depositing a second conductive layer (again preferably polysilicon), and patterning the layer in a manner similar to that used to pattern the first conductive layer to form the isolation and floating gates. The resulting structure is the cell illustrated in FIGS. 4A and 4B.

Thus it is apparent that there has been provided, in accordance with the invention, an EEPROM cell and methods for making and operating the same, that fully meet the need and advantages set forth previously. Although the invention has been described and illustrated with reference to specific embodiments thereof, it is not intended that the invention be limited to these illustrative embodiments.

Those skilled in the art will recognize that modifications and variations can be made without departing from the spirit of the invention. For example, the conductivity of the substrate and doped regions may be opposite of those illustrated herein. Also, a floating gate transistor may include a floating gate and control gate which are self-aligned to one another. Moreover, the are various structural and fabrication possibilities for forming a combined floating gate and control gate combination, all of which are within the scope of this invention. In addition, the invention is not limited to a particular memory application. A cell as described herein may be used with nearly any type of electrically programmable read-only memory (EPROM), including a flash EEPROM (wherein more than one memory cell may be erased during the same erase operation), and an EEPROM. Therefore, it is intended that this invention encompass all such variations and modifications as fall within the scope of the appended claims.

We claim:

1. A method for making an electrically erasable and programmable memory cell, comprising the steps of:

providing a semiconductor substrate;

forming a tunnel dielectric on the semiconductor substrate;

depositing and patterning a first conductive layer on the tunnel dielectric to form an isolation gate and a floating gate on the tunnel dielectric;

forming an interlayer dielectric over the isolation gate and floating gate; and depositing and patterning a second conductive layer to form a control gate overlying the floating gate.

2. The method of claim 1 wherein the step of forming a tunnel dielectric comprises forming a tunnel oxide having a thickness of less than approximately 120 angstroms.

3. The method of claim 1 wherein the isolation gate has a first side and an opposing second side and wherein the floating gate has a first side and a second side, and further comprising the steps of:

forming a first doped region in the substrate approximately aligned to the first side of the isolation gate;

forming a second doped region in the substrate between the isolation gate and the floating gate and approximately aligned to the second side of the isolation gate and the first side of the floating gate; and forming a third doped region in the substrate approximately aligned to the second side of the floating gate;

wherein the first doped region is a source of an isolation transistor;

wherein the second doped region is a drain of the isolation transistor and a source of a floating gate transistor; and wherein the third doped region is a drain of the floating gate transistor.

4. The method of claim 3 wherein the tunnel dielectric is an only dielectric separating the isolation gate and the floating gate from the semiconductor substrate within the memory cell.

5. The method of claim 1 wherein the step of forming a tunnel dielectric comprises forming a tunnel dielectric having a substantially uniform thickness within the memory cell.

6. A method for making an electrically erasable and programmable memory cell comprising the steps of:

providing a semiconductor substrate;

forming a tunnel dielectric having a substantially uniform thickness on the semiconductor substrate;

forming a first gate electrode and a second gate electrode on the tunnel dielectric, wherein the first gate electrode and the second gate electrode are separated from the semiconductor substrate only by the tunnel dielectric within the memory cell;

doping the semiconductor substrate to form a first source region and a first drain region associated with the first gate electrode and a second source region and a second drain region associated with the second gate electrode; and forming a third gate electrode overlying the second gate electrode, and being separated therefrom by a dielectric material.

7. The method of claim 6 wherein the step of forming a tunnel dielectric comprises thermally growing a silicon dioxide layer on the semiconductor substrate.

8. The method of claim 6 wherein the step of forming a tunnel dielectric comprises forming a tunnel dielectric having a substantially uniform thickness of less than 120 angstroms.

9. The method of claim 6 wherein the step of forming a first gate electrode and a second gate electrode comprises forming a floating gate electrode as the second gate electrode, and wherein the step of forming a third gate electrode comprises forming a control gate electrode as the third gate electrode.

10. The method of claim 6 wherein the step of doping the semiconductor substrate comprises doping such that the first drain region and the second source region occupy a same area of the semiconductor substrate.

11. The method of claim 6 wherein the step of doping the semiconductor substrate comprises doping the semiconductor substrate to form a first source region and a first drain region which are both self-aligned relative to the first gate electrode, and doping the semiconductor substrate to form a second source region and a second drain region which are both self-aligned relative to the second gate electrode.

12. A method for making an electrically erasable and programmable memory cell comprising the steps of:

providing a semiconductor substrate;

forming a tunnel dielectric on the semiconductor substrate having a substantially uniform thickness of less than 120 angstroms;

depositing a first polysilicon layer on the tunnel dielectric;

patterning the first polysilicon layer to form an isolation gate electrode of an isolation transistor and a floating gate electrode of a floating gate transistor on the tunnel dielectric;

forming source and drain regions for the isolation transistor and for the floating gate transistor in the semiconductor substrate;

forming an interpoly dielectric layer over the floating gate electrode;

depositing a second polysilicon layer over the interpoly dielectric layer; and patterning the second polysilicon layer to form a control gate electrode of the floating gate transistor.

13. The method of claim 12 wherein the step of forming source and drain regions comprises, forming a first doped region in the semiconductor substrate to serve as a source of the isolation transistor, forming a second doped region in the semiconductor substrate to serve as a drain of the isolation transistor and as a source of the floating gate transistor, and forming a third doped region in the semiconductor substrate to serve as a drain of the floating gate transistor.

14. The method of claim 13 wherein the first and the second doped regions are self-aligned relative to the isolation gate electrode and the second and the third doped regions are self-aligned relative to floating gate electrode.

15. The method of claim 12 wherein the step of forming a tunnel dielectric comprises thermally growing silicon dioxide on the semiconductor substrate.

16. The method of claim 12 wherein the isolation gate electrode and the floating gate electrode are formed such that the tunnel dielectric is an only dielectric which separates the isolation gate electrode and the floating gate electrode from the semiconductor substrate within the memory cell.

17. The method of claim 12 wherein the isolation gate electrode and the floating gate electrode are formed such that the isolation gate electrode and the floating gate electrode are separated from the semiconductor substrate only by the substantially uniform thickness of the tunnel dielectric.

* * * * *